United States Patent
Liew et al.

(10) Patent No.: US 11,086,074 B1
(45) Date of Patent: Aug. 10, 2021

(54) INHIBITING CRYSTAL GROWTH IN OPTICAL WAVEGUIDE STRUCTURES, FOR REDUCED ABSORPTION AND INSERTION LOSS USING OPTICALLY-PASSIVE DOPANTS IN THE CORE

(71) Applicant: DICON FIBEROPTICS, INC., Richmond, CA (US)

(72) Inventors: Seng Fatt Liew, Berkeley, CA (US); Yizhuo He, Richmond, CA (US); Ho-Shang Lee, El Sobrante, CA (US)

(73) Assignee: DICON FIBEROPTICS, INC., Richmond, CA (US)

( * ) Notice: Subject to any disclaimer, the term of this patent is extended or adjusted under 35 U.S.C. 154(b) by 0 days.

(21) Appl. No.: 16/924,025

(22) Filed: Jul. 8, 2020

Related U.S. Application Data (60) Provisional application No. 62/988,330, filed on Mar. 11, 2020.

(51) Int. Cl.
*G02B 6/134* (2006.01)
*G02B 6/136* (2006.01)
(Continued)

(52) U.S. Cl.
CPC ............ *G02B 6/1347* (2013.01); *C23C 14/48* (2013.01); *C23C 14/5846* (2013.01);
(Continued)

(58) Field of Classification Search
CPC .................. G02B 6/1347; G02B 6/136; G02B 2006/1208; G02B 2006/12169; C23C 14/48; C23C 14/5846
See application file for complete search history.

(56) References Cited

U.S. PATENT DOCUMENTS

| | | | | |
|---|---|---|---|---|
| 6,865,018 B2 * | 3/2005 | Frolov | ................ | H01S 3/06758 359/337.4 |
| 7,382,957 B2 * | 6/2008 | Chen | ................. | C03B 37/01217 385/123 |

(Continued)

OTHER PUBLICATIONS

Evans, Christopher C., et al., "Low-loss titanium dioxide waveguides and resonators using a dielectric lift-off fabrication process," Optical Society of America, vol. 23, No. 9, Apr. 2015, 10 pages.

(Continued)

*Primary Examiner* — Andrew Jordan
(74) *Attorney, Agent, or Firm* — Vierra Magen Marcus LLP (57) ABSTRACT

Methods and techniques are presented to inhibit crystallization in optical waveguide structures, during high temperature annealing or deposition, thus preventing the formation of crystalline grains that scatter and/or absorb light. Dopant atoms or molecules are used to disrupt crystallization. The dopant atoms or molecules are selected to be transparent to the optical signal's wavelength range(s). Optical signals propagating in a waveguide that is fabricated with such techniques will experience reduced propagation loss or insertion loss. The passive dopants can also be used in active devices such as lasers or optical amplifiers that incorporate optically active dopants, as long as the passive dopants are chosen so that they do not interact with the active dopants.

30 Claims, 9 Drawing Sheets

(51) Int. Cl.
*C23C 14/48* (2006.01)
*C23C 14/58* (2006.01)
*G02B 6/12* (2006.01)

(52) U.S. Cl.
CPC ...... *G02B 6/136* (2013.01); *G02B 2006/1208* (2013.01); *G02B 2006/12169* (2013.01)

(56) References Cited

U.S. PATENT DOCUMENTS

| | | | |
|---|---|---|---|
| 7,831,123 B2* | 11/2010 | Sparacin | G02B 6/132 385/131 |
| 8,538,223 B2* | 9/2013 | Zhang | G02B 6/1223 385/131 |
| 10,921,616 B2* | 2/2021 | Yu | H01L 21/78 |
| 2007/0177846 A1* | 8/2007 | Chen | G02B 6/105 385/125 |
| 2013/0071082 A1* | 3/2013 | Gagnon | G02B 6/03638 385/124 |

OTHER PUBLICATIONS

Shaw, L.B., et al., "Waveguide amplifiers in sputtered films of Er3+-doped gallium lanthanum sulfide glass," Optical Society of America, vol. 14, No. 5, Feb. 2006, 7 pages.

\* cited by examiner

Without dopants

With dopants

INHIBITING CRYSTAL GROWTH IN OPTICAL WAVEGUIDE STRUCTURES, FOR REDUCED ABSORPTION AND INSERTION LOSS USING OPTICALLY-PASSIVE DOPANTS IN THE CORE

PRIORITY CLAIM

This application claims the benefit of U.S. provisional patent application No. 62/988,330, filed Mar. 11, 2020, which is hereby incorporated in its entirety by this reference.

BACKGROUND

This disclosure relates to optical waveguides and techniques for their formation.

Optical waveguides, in which light is confined and propagates, are the fundamental building blocks of many nanophotonics devices. An important figure of merit for an optical waveguide is its propagation loss or insertion loss. As light propagates along a waveguide, energy can be lost through scattering or absorption by impurities, structural imperfections, or surface roughness of optical interfaces. The optical intensity of a signal is attenuated as it propagates along the waveguide, and in many applications this limits the total optical path length. However, many photonic devices require long optical path lengths for signal routing, filtering, amplification, resonators, etc. Therefore, a low-loss waveguide which allows light to propagate over a long distance without significant attenuation is highly desirable as a building block for photonic devices.

SUMMARY

In one set of embodiments, a method of forming an optical waveguide structure includes selecting one or more dopant materials configured to be optically passive in a first range of optical signal wavelengths. A substrate cladding layer is formed and a waveguide core material, including the selected dopant materials, is deposited on the substrate cladding layer. The waveguide core material is etched to define a waveguide core and the waveguide core material is annealed. Subsequent to annealing the waveguide core material and etching the waveguide core material, an upper cladding material is formed over the defined and annealed waveguide core.

In another set of embodiments, a method of forming an optical waveguide structure includes selecting one or more dopant materials configured to be optically passive in a first range of optical signal wavelengths. A substrate cladding layer is formed and a high temperature deposition of a waveguide core material, including the selected dopant materials, is performed on the substrate cladding layer. The waveguide core material is etched to define a waveguide core and the waveguide core material is annealed. Subsequent to annealing the waveguide core material and etching the waveguide core material, an upper cladding material is formed over the defined and annealed waveguide core.

In other embodiments, an optical waveguide includes a substrate cladding and an upper cladding formed over the substrate cladding. A waveguide core is formed between the substrate cladding and upper cladding. The waveguide core includes: one or more first dopant materials configured to be optically active in a first set of one or more wavelength ranges; and one or more second dopant materials configured to optically passive in the first set of one or more wavelengths ranges and configured to not have ion-to-ion interactions that allow energy transfer between the second dopant materials and the first dopant materials.

Various aspects, advantages, features, and embodiments are included in the following description of examples thereof, which description should be taken in conjunction with the accompanying drawings. All patents, patent applications, articles, other publications, documents, and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

The following presents methods and techniques to inhibit crystallization in optical waveguide structures, during high temperature annealing or deposition, thus preventing the formation of crystalline grains that scatter and/or absorb light. Dopant atoms or molecules are used to disrupt crystallization. The dopant atoms or molecules are selected to be transparent to the optical signal's wavelength range(s). Optical signals propagating in a waveguide that is fabricated with such techniques will experience reduced propagation loss or insertion loss. The passive dopants can also be used in active devices such as lasers or optical amplifiers that incorporate optically active dopants, as long as the passive dopants are chosen so that they do not interact with the active dopants.

Figure 1A:
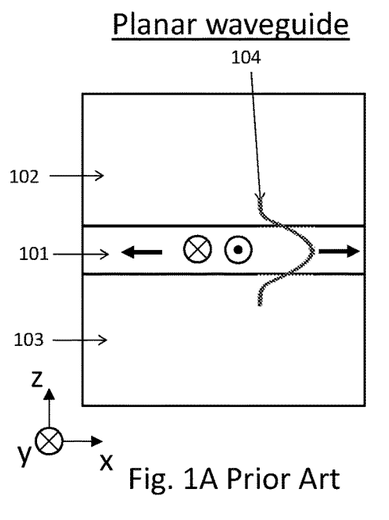
FIGS. 1A, 1B, and 1C show a various configurations of optical waveguide structures.
Figure 1B:
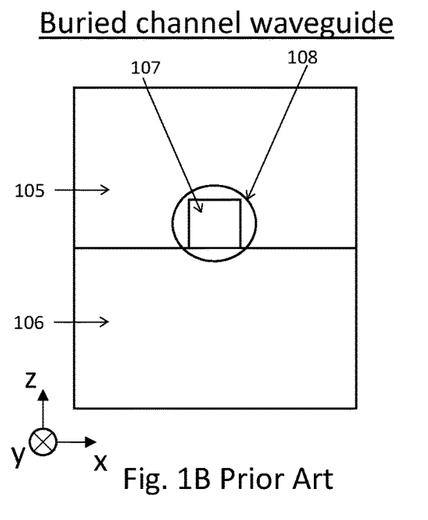
Figure 1C:
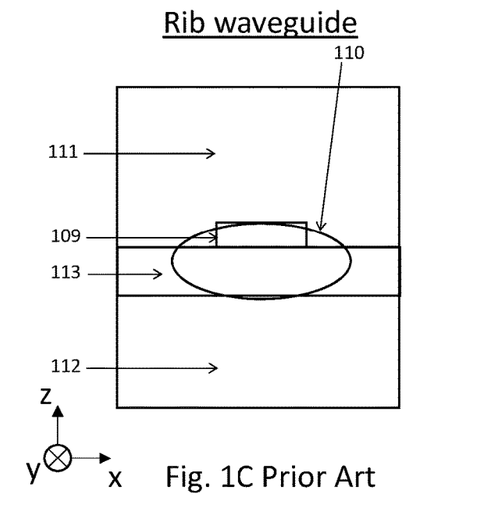

FIGS. 1A, 1B, and 1C show various types of prior art optical waveguides. An optical waveguide typically includes a core with higher refractive index than the surrounding cladding areas, in order to confine and guide light along the waveguide through total internal reflection. FIG. 1A shows a prior art planar waveguide comprising a core layer 101 surrounded by two cladding layers, a cover layer 102 and a substrate layer 103, which have lower refractive index than the core 101. The power of the optical wave is confined in the core layer in the z-direction, but can propagate freely in the x-y plane. In a common implantation, the thickness of the core layer 101 can range from a few hundred nanometers to tens of micrometers depending on the wavelength of the optical signal, and the desired number of optical modes. The electric field intensity of the fundamental guided mode (104) has a peak power at around the center of the core and its intensity is reduced at the two cladding interfaces. A portion of the electric field may penetrate into the cladding layers 102 and 103, which have lower refractive indices. This is known as the evanescent field of the guided mode.

A buried channel waveguide can be used to confine light in two directions, and in FIG. 1B, the light is confined in the z-direction and the x-direction, with light propagation in the y-direction. FIG. 1B thus represents an end view of a prior art buried channel waveguide. The core 107 is surrounded by cover cladding layer 105 and a substrate cladding layer 106, which have lower refractive indices. Most of the power of the guided mode is confined inside the core 107 with some evanescent field 108 extending into the cladding layers 105 and 106.

Confinement in the x-direction can also be achieved by fabricating a rib structure 109 on the core layer 113, as shown in FIG. 1C. This form of prior art waveguide is called a rib waveguide, and is usually fabricated by etching away some of the core material to form a protruding rib. The height and width of the rib determines the optical power confinement of the guided mode. A shallow rib will result in weak confinement and the electric field intensity of the guided mode 110 will be extended in the x-direction. The rib structure 109 can also be fabricated from materials different than the core layer 113, and may also be separated at a small distance (sub-nanometers to hundreds of nanometers) from the core layer 113.

Depending on the deposition techniques used in fabricating optical waveguide structures, small amount of impurities and structural imperfections (vacancies or interstitial atoms) usually exist in the as-deposited thin-film materials. For example, impurities such as hydrogen (H) or hydroxyl (OH) groups can be found in thin films of $SiO_2$ and $Si_3N_4$, deposited using LPCVD (Low Pressure Chemical Vapor Deposition) or PECVD (Plasma-Enhanced Chemical Vapor Deposition), as well as films made with sol-gel methods. These inherent impurities can absorb light, and thus their level should be kept as low as possible. Inert gases used in sputtering can also be incorporated inside the as-deposited film as well. Materials deposited at low temperature (<500° C.) are in an amorphous state, and usually contain a lot of structural imperfections. This type of amorphous film tends to be porous and have lower density than the same material in its bulk form. These inherent impurities and porosities are defect centers that can either absorb or scatter light, and they have to be eliminated in order to reduce the propagation loss or insertion loss of an optical waveguide.

Thermal annealing is a method that is commonly used in the semiconductor industry to produce high quality thin-film materials with low defect density. High temperature annealing causes atoms to diffuse and relax to a more stable state, with higher density, and much lower levels of structural imperfections. Post-thermal annealing is usually used to reduce the number of defects by baking the thin film either in a furnace over long hours, or in a machine with a high-intensity radiative heating element for rapid thermal annealing (RTA). The inherent impurity atoms such as hydrogen or other elements can be driven out from the thin-film material, by annealing the thin film in an environment that is deficient or lacking in the impurity elements. As a result, post-thermal annealing is a technique that can be used to reduce the density of defects in the amorphous as-deposited film, thereby reducing waveguide insertion loss.

Figure 2:
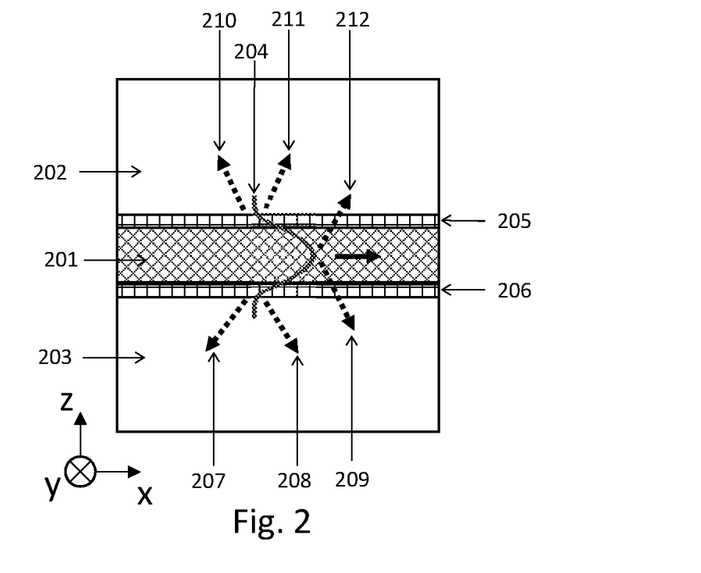
FIG. 2 illustrates the effects of crystallization on light that is propagating down a representative prior art optical waveguide structure.

Deposition and annealing at higher temperature are beneficial, as the diffusion of impurity atoms helps to reduce defects in an as-deposited thin film. However, atom diffusion will eventually lead to a transition of the thin-film material from a less-ordered amorphous phase to a more-ordered poly-crystalline phase. Crystallization is detrimental to light propagation, as the grain-like crystalline domains and their boundaries will scatter and/or absorb light. As shown in FIG. 2, crystallization happens both within the high-index core 201 and at the interface region with substrate cladding layer 203 and cover cladding layer 202. Crystalline grains can form within substrate cladding 203 and cover cladding 202 as well. The regions 205 and 206, which contain rough interfaces due to crystallization, will scatter light. The scattered light components 207, 208, 210, 211, will no longer be guided within the high-index core and thus the optical signal intensity is attenuated. Scattering will also happen within the high-index core, such that the scattered components 209 and 212 can leak from the core as well. The boundaries between poly-crystalline grains can also induce additional loss through absorption by surface defect states. In addition, the thin film will eventually crack if the annealing temperature goes too high. As a result, crystallization of the amorphous materials at high temperature represents a physical limitation to the propagation of optical signals through a waveguide.

The methods and techniques presented in the following inhibit crystallization in optical waveguide structures during high temperature annealing or deposition, thus preventing the formation of crystalline grains that scatter and/or absorb light. Optical signals propagating in a waveguide that is fabricated with such techniques will experience reduced propagation loss or insertion loss.

Figure 3:
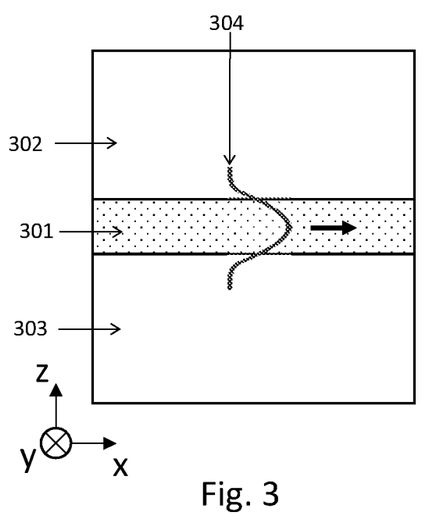
FIG. 3 shows a representative diagram of one embodiment in which an optical waveguide's core is doped with elements or compounds that are transparent to the optical signal's wavelength range(s).

In a first set of embodiments, as shown in FIG. 3, the waveguide core 301 is doped with elements or compounds that are transparent in the signal wavelength range. The waveguide core 301 is surrounded by substrate cladding layer 303 and cover cladding layer 302. The doping concentration in the waveguide core 301 can be well controlled, and the chosen dopants are optically passive, meaning that they will not absorb or emit photons in wavelength range of interest. Therefore, these passive dopants are different from the inherent impurities that exist in the as-deposited thin films, which may or may not absorb or emit light.

The materials of the substrate cladding layer 303 and cover cladding layer 302 can either be doped or remain not doped, depending on their crystallization temperature(s), with respect to the waveguide core (301) material. When substrate cladding layer 303 and cover cladding layer 302 have lower crystallization temperature than the waveguide core 301, they can be doped to prevent formation of crystalline grains at the interface between the core and substrate cladding, as well as between the core and cover cladding. The core geometry or choice of core cross-section shape includes, but is not limited to, planar waveguides, buried channel waveguides, or rib waveguides, as shown in FIG. 1. The core geometry can consist of any arbitrary shape, as long as it can confine an optical mode. Examples of other core-geometries include "U"-shape, "V"-shape, core-shell, box-shaped, etc.

The waveguide core 301 can be made of oxides, dielectrics, composite materials, chalcogenide glasses, or other materials that are transparent in the optical signal wavelength range(s) of interest. Potential materials include, but are not limited to, silicon, silicon nitride ($Si_3N_4$), silicon oxynitride (SiON), tantalum pentoxide ($Ta_2O_5$), niobium pentoxide ($Nb_2O_5$), aluminum oxide ($Al_2O_3$), yttrium oxide ($Y_2O_3$), doped silicon oxide, silicates, or other materials that have higher refractive index than the substrate cladding layer 303 and the cover cladding layer 302.

The substrate cladding layer 303 and the cover cladding layer 302 consist of materials that have a lower refractive index than that of the waveguide core 301. For example, the cladding layers can be made of silicon dioxide ($SiO_2$), aluminum oxide ($Al_2O_3$), as well as other materials. A waveguide can also be formed or configured without a substrate cladding layer 303 and/or a cover cladding layer 302, in which case the waveguide may be effectively suspended in air.

Embodiments for an optical waveguide structure, as shown in FIG. 3, can be fabricated by first depositing the waveguide core material on top of a substrate or a buffer layer which has lower refractive index. Subsequently, chemical or ion beam etching is used to define the waveguide core's geometry. The defining of the waveguide core's geometry is followed by a top or cover cladding layer deposition, of a material which has lower refractive index than the core's material.

Typical materials for both the cladding layers and the waveguide core are oxides and dielectrics that are transparent in the wavelength range(s) of interest. Various deposition techniques can be used to deposit the materials used for the substrate cladding layer, the waveguide core, and the top or cover cladding layer. The deposition techniques include high temperature growth techniques such as thermal oxidation, low pressure chemical vapor deposition (LPCVD), metal organic chemical vapor deposition (MOCVD), and atomic layer deposition (ALD). Low temperature deposition techniques may also be used, such as physical vapor deposition (PVD), sputtering, evaporation, pulsed laser deposition (PLD), etc. Plasma enhanced chemical vapor deposition (PECVD) and sol-gel methods can be used as well.

Post-deposition thermal annealing can be used to reduce the propagation loss or insertion loss of an optical waveguide, following the deposition of the core material and/or the top or cover cladding material. Annealing can be carried out using a furnace or rapid thermal annealing (RTA) tools, in order to reduce or eliminate defects in the amorphous materials.

Figure 4:
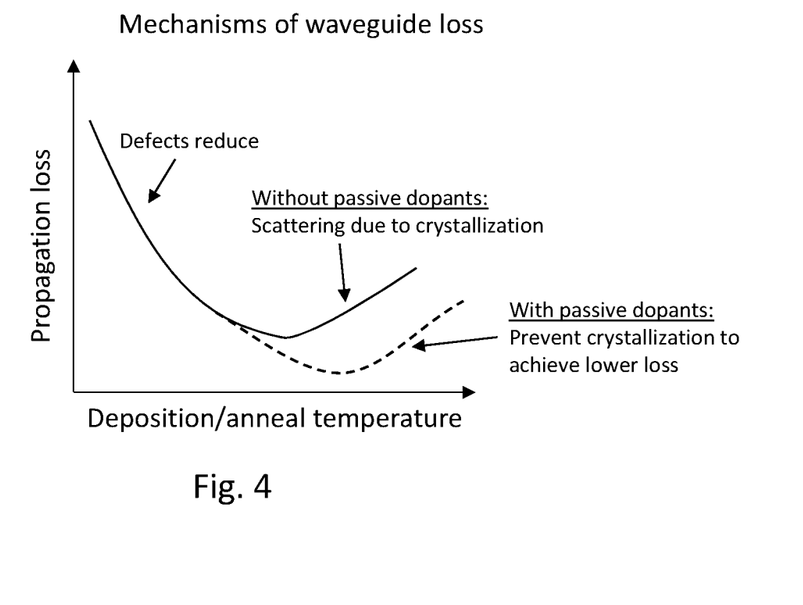
FIG. 4 illustrates the effects on waveguide propagation loss or insertion loss, as a function of deposition or annealing temperature.

FIG. 4 illustrates the waveguide loss reduction mechanisms and the expected outcome when the waveguide is fabricated using the methods described here. Deposition or post-deposition annealing at high temperature (such as from 300 C to 1300 C) helps to reduce propagation loss or insertion loss in an optical waveguide, because the inherent impurities and structural imperfections in the as-deposited material are being reduced or eliminated. However, when the temperature is increased beyond a certain level, the thermal energy is sufficient to form crystalline grains. As shown in FIG. 4, at temperatures beyond this minimum point on the propagation loss curve, the propagation loss or insertion loss will increase again. Using the method and techniques presented here, the introduction of passive dopants into the waveguide's materials will serve to inhibit or delay this crystallization process, moving the minimum of the curve to a higher temperature and lower propagation loss. Consequently, the method and techniques described here allow annealing or deposition at even higher temperatures, to further eliminate defects and crystallization effects. This further reduces the propagation loss or insertion loss of the waveguide to a much lower level.

Figure 5:
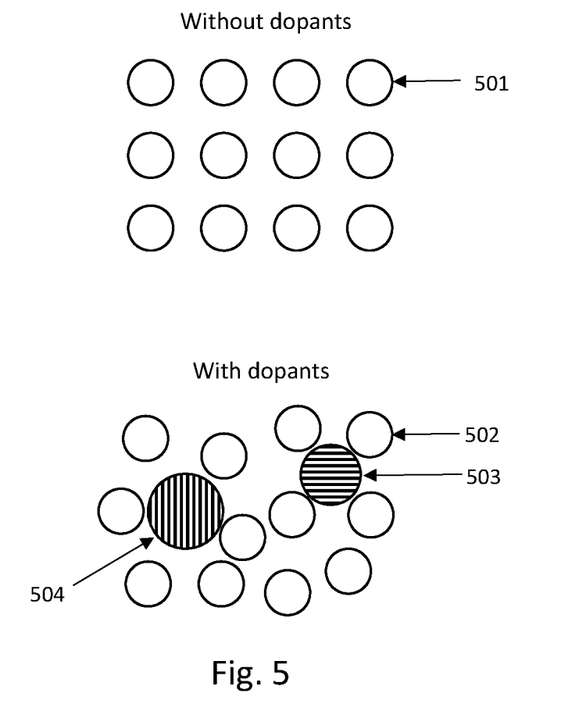
FIG. 5 illustrates the use of large atoms or molecules as dopants for the prevention of crystallization in waveguide materials.

When the waveguide material has very high purity, it is easy for the deposited thin film to crystallize at high temperature. Most of the thin film materials deposited using the above-mentioned techniques (sputtering, CVDs, etc.) are originally in an amorphous state. As illustrated in FIG. 5, with sufficient thermal energy during annealing, the host material atoms 501 will diffuse and eventually settle into a perfect lattice structure, thereby resulting in crystallization. Poly-crystalline grains are usually formed during the transition from amorphous to crystalline. These grains will attenuate the optical signal intensity and increase the propagation loss or insertion loss of the waveguide.

In its lower portion, FIG. 5 also shows what happens when the method and techniques described here are used to inhibit or delay the crystallization process, using large size dopants. These dopants are introduced into the waveguide materials to prevent the host material atoms 502 from settling into well-ordered lattice sites during annealing. The dopants 503 and 504 can consist of the same or different types of elements or compounds. These dopants are selected to be optically passive in the intended range(s) of operational wavelengths and will not introduce additional scattering or absorption loss to the light that is propagating in a waveguide.

Either single element atoms or molecules, or compounds of multiple elements, can be used to dope the waveguide core, substrate and/or cladding materials, but they must be chosen to have spectral absorption lines that are beyond, or outside of, the optical signal wavelength range(s). Otherwise, it can defeat the purpose of reducing propagation loss or insertion loss in the waveguide. Elements considered here include various alkaline earth metals, transition metals, and rare-earth elements in the lanthanides series that have large atomic radius. Compounds of these elements are within the scope of this discussion, as well. Large size atoms and molecules will introduce significant spatial distortion to the host material structure on the atomic scale, as illustrated in FIG. 5. This distortion increases the energy required to form a long-range or large-scale ordered lattice structure, and thus inhibits or delays the phase transition from an amorphous state to a crystalline state. As a result, a waveguide structure can be annealed or deposited at high temperature without forming crystalline grains. Waveguide structures made with such doped materials can have much lower propagation loss or insertion loss, compared to those made of high purity materials.

Examples of elements considered for use as optically passive dopants include alkaline earth metals like strontium (Sr), barium (Ba), and radium (Ra), transition metals such as scandium (Sc), tantalum (Ta), yttrium (Y), hafnium (Hf), tungsten (W), molybdenum (Mo), titanium (Ti), vanadium (V), and zirconium (Zr), and all rare-earth elements in the lanthanide series (i.e., the metallic elements with atomic numbers ranging from 57 through 71). Oxides or compounds that contain any of these elements are also with the scope of the techniques described here. These elements are chosen because of their large atomic radius, which will bring the most distortion to the lattice structure, and thus be able to prevent the formation of crystalline grains.

More than one type of element or related compounds can be doped into the materials of a waveguide structure. As the crystallization transition is expected to become even more difficult when the host material contains dopants of different sizes, the use of multiple types of elements or compounds will further amplify the lattice distortion effect.

Depending on the embodiment, example concentrations of the optically passive dopants can range from 0.01 at % to 10 at % (the percentage of dopant atoms to the total number of atoms in the material). Higher dopant concentrations may cause phase separation from the host material and formation of crystalline grains that made up solely of the individual doped elements or compounds.

Dopants can be introduced into the host material either during the host material deposition or afterwards. For example, dopants can be incorporated into the host material during deposition of the host material, using sputtering, PLD and/or evaporation, via the addition of dopant target materials. Pre-cursor gases or molecules containing the dopant elements or compounds, can be used during CVD growth processes, or when using sol-gel methods.

In active optical devices such as lasers and optical amplifiers, dopants are typically used to generate luminescence through atomic transition between two energy levels, based on electrical or optical excitation of the dopants. These dopants can be considered to be active, as the dopant atoms or molecules will first be excited to higher energy level(s) and then decay to lower energy level(s), accompanied by emission of photons. Materials that contain active dopants are referred to as gain materials, as they provide optical gain to the original optical signal intensity.

Active dopants are selected to be "active" in specific wavelength ranges based on their absorption bands, emission bands, or both. Some examples of active dopants are erbium (Er), thulium (Tm), and praseodymium (Pr). Erbium is used for both the C-band (approximately 1525-1565 nm) and the L-band (approximately 1570-1610 nm), Thulium is used for the S-band (approximately 1450-1490 nm). Praseodymium is used for the O-band (in the 1300 nm region). The wavelength regions for these examples are the wavelength ranges in which these dopants emit light, and therefore are the wavelength ranges where optical signals will be amplified. Other, shorter wavelengths are used to energize the active dopant ions. For example, 980 nm and 1480 nm "pump laser" wavelengths are typically used to energize Erbium ions. Erbium is therefore absorbent in these pump wavelengths, so that is optically active in both the wavelength ranges in which it emits (the C-band and L-band) and the wavelength ranges in which it absorbs (around 980 nm and 1480 nm).

Thermal annealing is commonly used to activate these active dopants in the gain material, which can contain defects as discussed above. Reduction of the defect density in gain materials serves to eliminate the non-radiative transfer of energy from the active ions to the defect centers, and therefore enables a brighter luminescence from the dopant ions. However, crystalline grains formed at high temperature annealing will create defect states that can quench the luminescence of these active ions. As a result, the optical gain for lasers and optical amplifiers will be limited.

In another embodiment, passive dopants can be introduced into the gain materials to prevent crystallization during annealing. The two types of dopants (passive and active) can co-exist within the same material, as long as there are no ion-to-ion interactions that allow energy transfer between the two types of dopants. Consequently, when introducing passive dopants into an optical waveguide with active dopants, the passive dopants are selected to be optically passive in the range that the optically active dopants of the gain device are selected to be active, both for absorption and emission, and to not have ion-to-ion interactions that allow energy transfer between the two types of dopants. Therefore, in a waveguide based optical amplifier or laser, the passive dopants can be used to both reduce the propagation loss or insertion loss of the waveguide structure, as well as improving the efficiency of the active dopant ions, following thermal annealing.

Figure 6A:
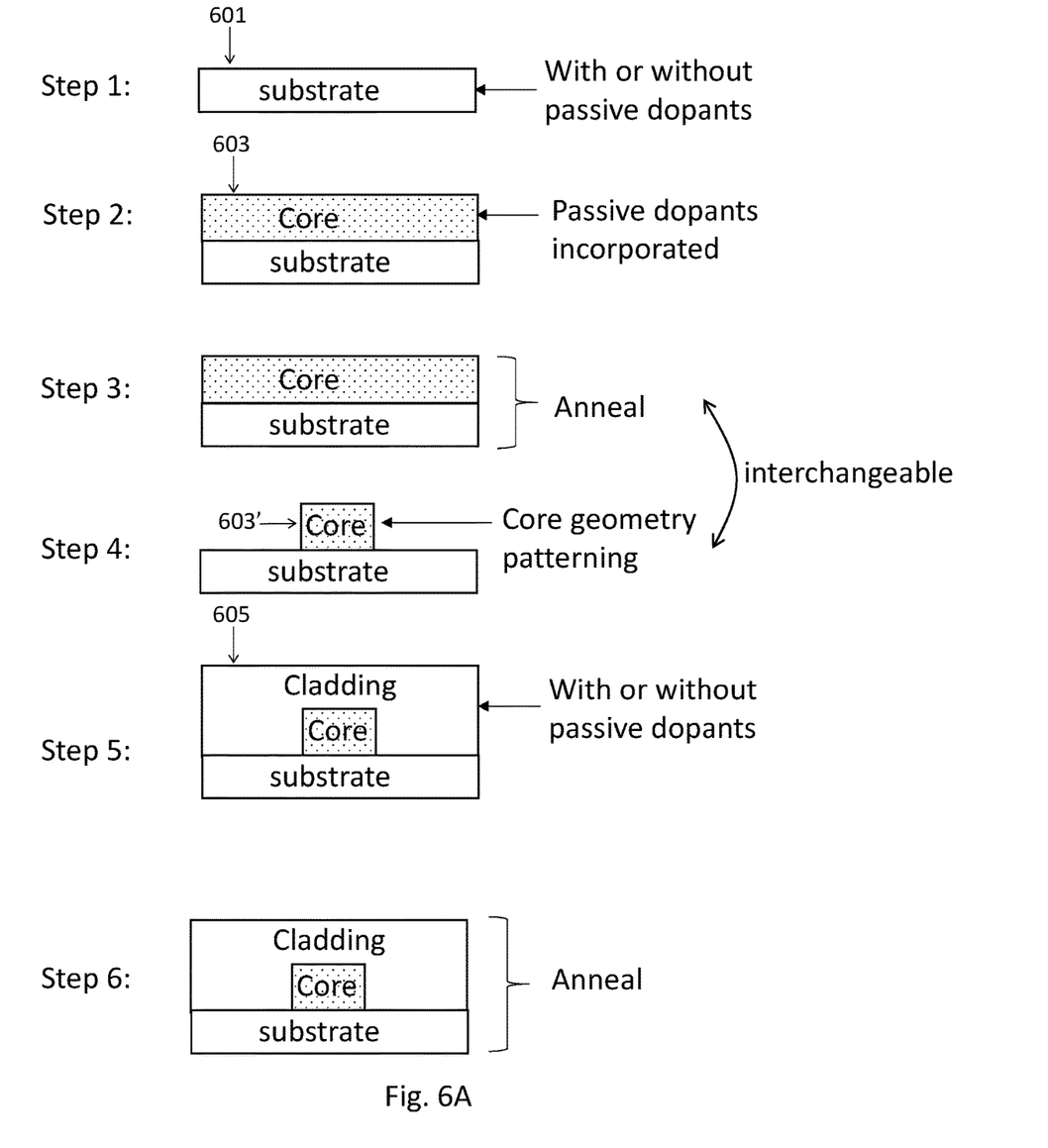
FIGS. 6A and 6B illustrate the stages for two embodiments for forming optical waveguide structures incorporating optically passive dopants.
Figure 6B:
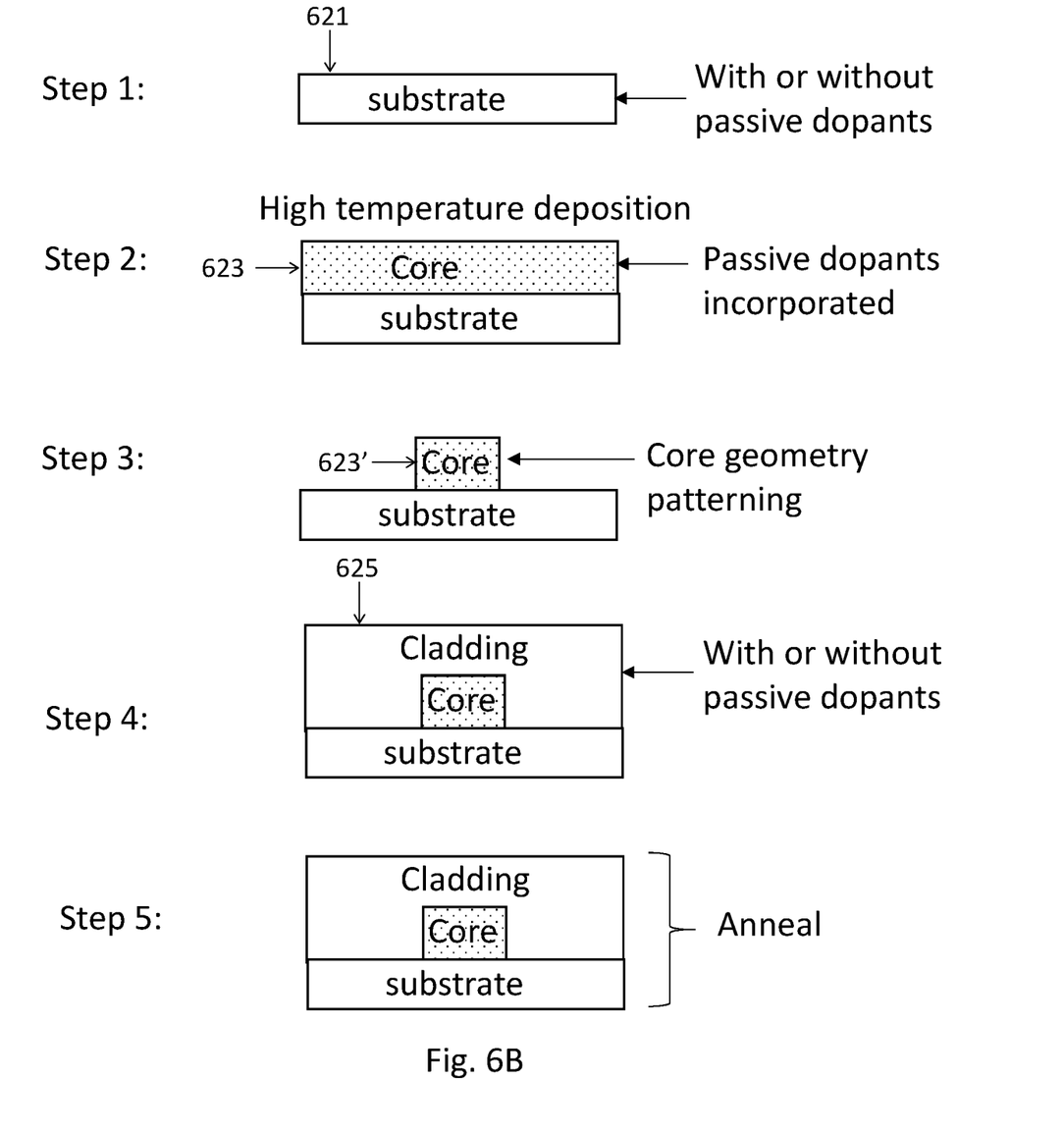
Figure 7A:
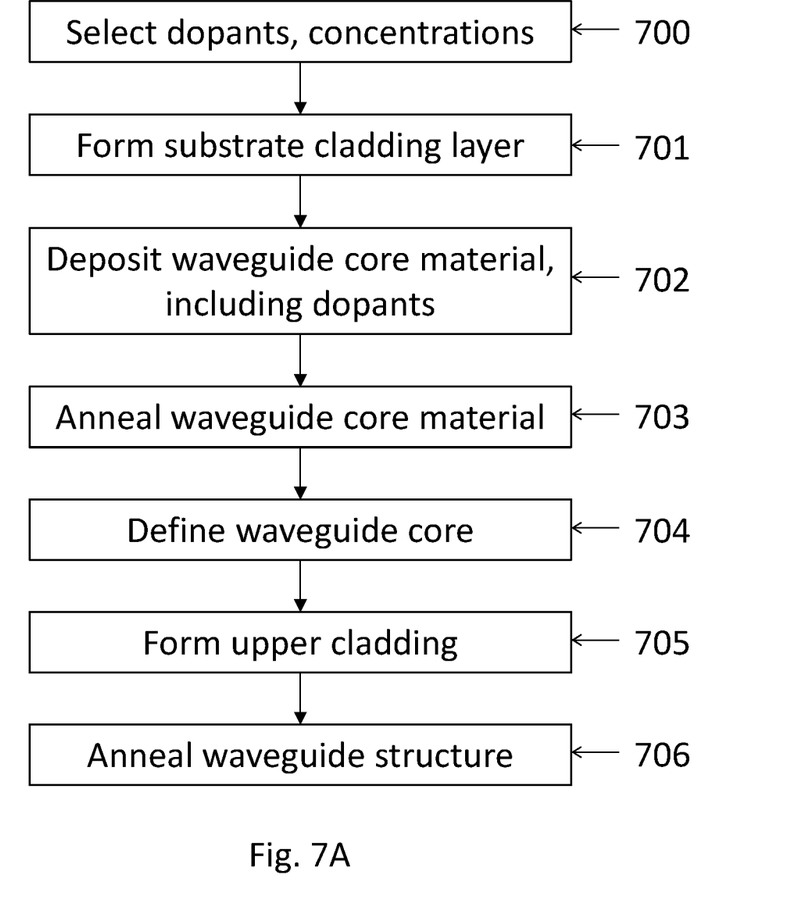
FIGS. 7A and 7B are flowcharts for the processes of FIGS. 6A and 6B.
Figure 7B:
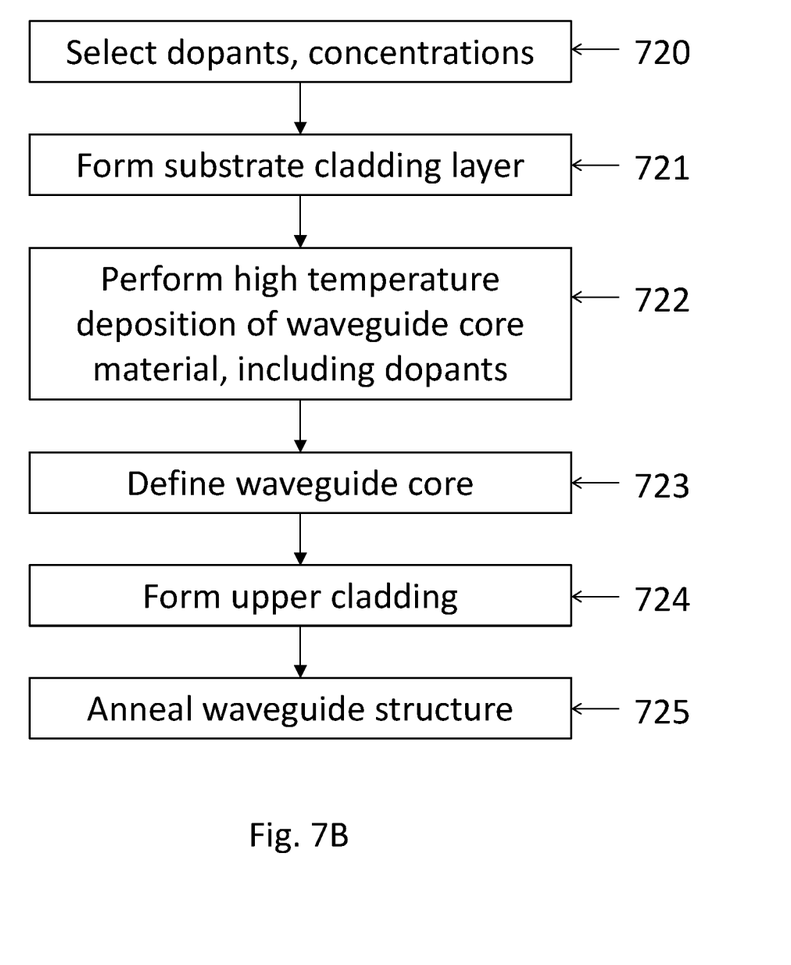

FIGS. 6A and 6B illustrate embodiments for the forming of optical waveguide structures incorporating optically passive dopants in which the core material is deposited and then annealed, and in which the core includes the passive dopants if formed in a high temperature deposition, respectively. FIGS. 7A and 7B are flow charts respectively corresponding to the embodiments of FIGS. 6A and 6B.

Considering the process of the FIG. 6A and corresponding flow of FIG. 7A, prior to the passive dopants being introduced in the structure, the one or more passive dopants and their concentrations are selected in step 700. The passive dopant or dopants are selected so that they are configured to the optically passive in frequency ranges within which the optical waveguide is to be used. If any active dopants are also being used in the core region, the passive dopants are additionally selected so that they will not have ion-to-ion interactions that would allow energy transfer between the two types of dopants. If passive dopants are also to be included in any of the cladding layers, these can also be selected as part of step 700.

The substrate cladding layer 601 is formed in step 701 of FIG. 7A and as shown at step 1 of FIG. 6A. In some embodiments the substrate cladding layer 601 can include optically passive dopants, which can be included into the substrate 601 as it is formed and/or added in a subsequent process, such as by ion implantation. As discussed above, the substrate cladding layer 601 is chosen to have a lower refractive index than that of the waveguide core.

The waveguide core material 603 is then formed over the substrate layer 601 as shown in step 2 of FIG. 6A and performed at step 702 of FIG. 7A. As described in more detail above, the waveguide core material 603 can be made of oxides, dielectrics, composite materials, chalcogenide glasses, or other materials that are transparent in the optical signal wavelength range(s) of interest and that have a higher refractive index than the substrate cladding layer 601 and the upper cover cladding layer 605. The waveguide core material 603 incorporates the passive dopants as selected in step 700 and, in some embodiments, will also include active dopants for the selected frequency ranges. Examples of materials for the optical core and for the passive dopants and, if included, active dopants are described above. The dopants can be incorporated into the waveguide core material 603 as part of the formation process and/or added subsequently, such as through ion implantation.

Once the waveguide core material 603, including the passive dopants has been deposited, it can be annealed as described above with respect to FIG. 4 at step 703 of FIG. 7A and as illustrated at step 3 of FIG. 6A. The waveguide core material 603 is then patterned to define the geometry of the waveguide core 603' at step 704, with an example of the resultant structure shown in step 4 of FIG. 6A. The optical core 603' can be defined by processes such as an ion etch or chemical etch, for example. As noted in FIG. 6A, the anneal of step 703 and the defining of the geometry for the optical core 603' at step 704 can be reversed, depending on the embodiment.

As illustrated at step 5 of FIG. 6A, the upper cladding material 605 is formed over the defined and annealed optical core 603' in step 705 of FIG. 7A. In some embodiments the upper cladding can material 605 incorporate optically passive dopants, either deposited along with the upper cladding material 605 and/or incorporated after the upper cladding material 605 has been formed. In some embodiments, an additional anneal can be performed at step 706 of FIG. 7A and as shown in step 6 of FIG. 6A. In still other embodiments, the initial anneal of step 703 can be skipped and only the anneal of step 706 included in the formation process.

FIGS. 6B and 7B correspond to an alternate set of embodiments in which the layer of the waveguide core material is formed using a high temperature deposition process. Step 720 of FIG. 7B determines the dopant or dopants to be used and can be as described above with respect to step 700 of FIG. 7A. At step 721, the substrate cladding layer 621 is formed as shown in step 1 of FIG. 6B, where this can be as described in step 701 of FIG. 7A and shown in step 1 of FIG. 6A.

The waveguide core material 623 is then formed over the substrate layer 621 in a high temperature deposition process, as shown in step 2 of FIG. 6B and performed at step 722 of FIG. 7B. The dopants, both optically passive and optically active (if included), are introduced as part of the high temperature deposition process. Unlike the process of FIGS. 6A and 7A, as the deposition process is a high temperature process, the subsequent anneal (step 3 of FIG. 6A, step 703 of FIG. 7A) is not included. As before, the waveguide core material 623 can be made of oxides, dielectrics, composite materials, chalcogenide glasses, or other materials that are transparent in the optical signal wavelength range(s) of interest and that have higher refractive index than the substrate cladding layer 621 and the upper cover cladding layer 625. The waveguide core material 623 incorporates the passive dopants as selected in step 720 and, in some embodiments, will also include active dopants for the selected frequency ranges. Examples of materials for the optical core and for the passive and, if included, active dopants are described above.

Once the waveguide core material 623 is deposited, it can then be defined at step 723 and as shown at step 3 of FIG. 6B for the waveguide core 623', where this process can be as described above for step 704 of FIG. 7A and in step 4 of FIG. 6A. Step 724, as illustrated at step 4 of FIG. 6B, to form the upper cladding 625 can then follow as described above with respect to step 705 of FIG. 7A as shown in step 5 of FIG. 6A; and an anneal can be performed at step 725 of FIG. 7B and shown in step 5 of FIG. 6B, which can be performed as in step 706 of FIG. 7A and shown at step 6 of FIG. 6A.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

It is claimed:

1. A method of forming an optical waveguide structure, comprising:
   selecting one or more dopant materials configured to be optically passive in a first range of optical signal wavelengths;
   forming a substrate cladding layer;
   depositing a waveguide core material including the selected dopant materials on the substrate cladding layer;
   etching the waveguide core material to define a waveguide core;
   annealing the waveguide core material; and
   subsequent to annealing the waveguide core material and etching the waveguide core material, forming an upper cladding material over the defined and annealed waveguide core.

2. The method of claim 1, wherein the waveguide core material is annealed prior to being defined.

3. The method of claim 1, wherein the waveguide core material is annealed after being defined.

4. The method of claim 1, wherein annealing the waveguide core material is performed prior to forming the upper cladding material, the method further comprising:
   subsequent to forming the upper cladding material, further annealing the optical waveguide structure.

5. The method of claim 1, wherein depositing waveguide core material including the selected dopant materials on the substrate cladding layer includes:
   introducing the selected dopant materials into the waveguide core material subsequent to depositing the waveguide core material on the substrate cladding layer.

6. The method of claim 5, wherein introducing the selected dopant materials into the waveguide core material is performed in an ion implantation process.

7. The method of claim 1, wherein depositing waveguide core material including the selected dopant materials on the substrate cladding layer includes:
   introducing the selected dopant materials into the waveguide core material while depositing the waveguide core material on the substrate cladding layer.

8. The method of claim 1, further comprising:
   introducing optically active dopant materials into the waveguide core.

9. The method of claim 1, further comprising:
   introducing the selected dopant materials into the substrate cladding layer.

10. The method of claim 1, further comprising:
    introducing the selected dopant materials into the upper cladding material.

11. The method of claim 1, wherein the selected dopant materials include one or more dopant materials selected from rare-earth elements of the lanthanide series.

12. The method of claim 1, wherein the selected dopant materials include one or more dopant materials selected from alkaline earth metals.

13. The method of claim 1, wherein the selected dopant materials include one or more dopant materials selected from transition metals.

14. The method of claim 1, wherein the etching of the waveguide core material to define the waveguide core is a chemical etching process.

15. The method of claim 1, wherein the etching of the waveguide core material to define the waveguide core is an ion beam etching process.

16. A method of forming an optical waveguide structure, comprising:
- selecting one or more dopant materials configured to be optically passive in a first range of optical signal wavelengths;
- forming substrate cladding layer;
- performing a high temperature deposition of a waveguide core material including the selected dopant materials on the substrate cladding layer;
- etching the waveguide core material to define a waveguide core; and
- subsequent to annealing the waveguide core material and etching the waveguide core material,
- forming an upper cladding material over the defined and annealed waveguide core.

17. The method of claim 16, further comprising:
subsequent to forming the upper cladding material, annealing the optical waveguide structure.

18. The method of claim 16, further comprising:
introducing optically active dopant materials into the waveguide core.

19. The method of claim 16, further comprising:
introducing the selected dopant materials into the substrate cladding layer.

20. The method of claim 16, further comprising:
introducing the selected dopant materials into the upper cladding material.

21. The method of claim 16, wherein the selected dopant materials include one or more dopant materials selected from rare-earth elements of the lanthanide series.

22. The method of claim 16, wherein the selected dopant materials include one or more dopant materials selected from transition metals.

23. The method of claim 16, wherein the selected dopant materials include one or more dopant materials selected from alkaline earth metals.

24. The method of claim 16, wherein the etching of the waveguide core material to define the waveguide core is a chemical etching process.

25. The method of claim 16, wherein the etching of the waveguide core material to define the waveguide core is an ion beam etching process.

26. An optical waveguide, comprising:
- a substrate cladding;
- an upper cladding formed over the substrate cladding; and
- a waveguide core formed between the substrate cladding and upper cladding, the waveguide core including:
  - one or more first dopant materials configured to be optically active in a first set of one or more wavelength ranges; and
  - one or more second dopant materials configured to optically passive in the first set of one or more wavelengths ranges and configured to not have ion-to-ion interactions that hallow energy transfer between the second dopant materials and the first dopant materials.

27. The optical waveguide of claim 26, wherein one or both of the substrate cladding and the upper cladding include dopant materials configured to be optically passive in the first set of one or more wavelength ranges.

28. The optical waveguide of claim 26, wherein the one or more second dopant materials include one or more dopant materials selected from rare-earth elements of the lanthanide series.

29. The optical waveguide of claim 26, wherein the one or more second dopant materials include one or more dopant materials selected from alkaline earth metals.

30. The optical waveguide of claim 26, wherein the one or more second dopant materials include one or more dopant materials selected from transition metals.

\* \* \* \* \*

UNITED STATES PATENT AND TRADEMARK OFFICE
CERTIFICATE OF CORRECTION

PATENT NO. : 11,086,074 B1
APPLICATION NO. : 16/924025
DATED : August 10, 2021
INVENTOR(S) : Liew et al.

Page 1 of 1

It is certified that error appears in the above-identified patent and that said Letters Patent is hereby corrected as shown below:

In the Claims

Column 12, Lines 20-21 (Claim 26, Lines 9-10): After "to" and before "optically" insert -- be --.

Signed and Sealed this
Twelfth Day of April, 2022

Drew Hirshfeld
*Performing the Functions and Duties of the*
*Under Secretary of Commerce for Intellectual Property and*
*Director of the United States Patent and Trademark Office*